United States Patent [19]

Crosby

[11] 4,383,188

[45] May 10, 1983

[54] VOLTAGE-CONTROLLED CONSTANT CURRENT SOURCE

[75] Inventor: John B. Crosby, Yorba Linda, Calif.

[73] Assignee: Beckman Instruments, Inc., Fullerton, Calif.

[21] Appl. No.: 211,615

[22] Filed: Dec. 1, 1980

Related U.S. Application Data

[62] Division of Ser. No. 690,696, Nov. 14, 1978, Pat. No. 4,309,692.

[51] Int. Cl.³ ............................................. H03K 4/00
[52] U.S. Cl. .................................. 307/497; 307/498; 328/181; 330/252
[58] Field of Search .................. 330/51, 252; 307/228, 307/498; 328/181–185; 340/347 M, 347 NT, 347 AD

[56] References Cited

U.S. PATENT DOCUMENTS 3,930,252 12/1975 Storar ........................... 340/347 NT
4,082,998 4/1978 Marriott ............................ 324/99 D

FOREIGN PATENT DOCUMENTS 1417236 12/1975 United Kingdom .

OTHER PUBLICATIONS

*Linear Applications*, edited and published in 1973 by National Semiconductor Corp., pp. AN20-1 and AN20-6 and preface.

*Primary Examiner*—T. J. Sloyan
*Attorney, Agent, or Firm*—R. J. Steinmeyer; F. L. Mehlhoff

[57] ABSTRACT

An integrating analog-to-digital converter for converting an input signal having an amplitude representing an analog quantity into a digital signal representing the quantity wherein the input signal may have either a positive or negative polarity and the converter automatically generates the digital signal without regard to such polarity. The converter uses a single circuit for charging and discharging a capacitor such that any errors or offsets occurring upon charging are fully and automatically compensated for during discharging so as to provide for automatic zeroing of offset errors without separate autozeroing circuitry.

3 Claims, 5 Drawing Figures

VOLTAGE-CONTROLLED CONSTANT CURRENT SOURCE

This is a division, of application Ser. No. 960,696, filed Nov. 14, 1978, U.S. Pat. No. 4,309,692.

BACKGROUND OF THE INVENTION

1. Field of the Invention

The present invention relates to an integrating analog-to-digital converter and, more particularly, to a highly simplified and efficient auto-polarity integrating analog-to-digital converter including auto-zeroing of offset errors.

2. Description of the Prior Art

The present invention relates to analog-to-digital converters of the type which alternately charge and discharge an energy storing means for converting an unknown input signal into a digital signal. The charging and discharging of the energy storing means is done at different rates, at least one of such rates being dependent upon the amplitude of the unknown signal. By comparing the respective times of the charge and discharge cycles, a signal proportional to the amplitude of the input signal can be derived. This signal is converted into a digital signal by counting clock pulses during the charging and/or discharging cycles.

It is desirable that such a system be capable of operating automatically in response to a bipolar input signal, i.e. one which is either positive or negative with respect to a common potential. However, in such a system, it is critical to be able to accurately locate the point of common potential between the positive and negative full scale values. It is this necessity to auto-zero which has been the subject of numerous systems, since it is known that electrical circuit components inherently drift and it is impossible to make a system which will remain stable at a given common potential.

Theoretically, in order for a system to be stable, that which occurs during the charging cycle of the energy storing means must be exactly related to that which occurs during the discharging cycle of the energy storing means. In all known prior art systems, different circuits and/or circuit elements are involved in the charging and discharging cycles. Therefore, if one of these circuits or circuit elements drift, it will affect one cycle but not the other. Prior art attempts to solve this problem have been directed towards determining the amount of the drift and compensating therefor.

SUMMARY OF THE INVENTION

In accordance with the present invention, the problems encountered heretofore in a bipolar integrating analog-to-digital converter are solved in a manner which results in auto-zeroing of offset errors. This is achieved by using the exact same circuits and circuit elements in both the charging and discharging cycles of the energy storing means. In this manner, whatever offsets or drifts which occur and which affect one cycle, affect the other in an equal and opposite manner. The result is that these offsets and drifts are automatically compensated for, the only requirement being that the circuit elements be stable during a complete cycle of conversion.

The present system has no components which affect the location of the zero point and no additional compensation circuitry is required. The system permits the use of a comparison circuit in which the offset, speed of operation, and gain have no effect on the operation of the circuit and are of no operational concern. There is also no necessity for initializing the charge on the energy storing means.

Briefly, the present apparatus for converting an input signal which is bipolar with respect to a common potential and has an amplitude representing an analog quantity into a digital signal representing the quantity comprises a capacitor for storing energy, a constant current source having an input terminal adapted for receipt of a signal for determining the output current thereof, first switch means for alternately connecting the current source input terminal to the input signal during a first fixed time period and to the common potential during a second variable time period, a source of supply potential, second switch means operatively connecting the capacitor between the source of supply potential and the current source output, the current source modifying the charge on the capacitor from an initial charge, in a first direction, and at a rate determined by the input signal during the first time period and modifying the charge on the capacitor in an opposite direction and at a fixed rate during the second time period, means responsive to the capacitor for generating a timing signal when the charge thereon returns to the initial charge, means for generating regularly recurring timing pulses, counting means responsive to the timing pulses for continuously and alternately generating an up count and a down count between predetermined high and low counts, timing circuit means responsive to the counting means and the timing signal generating means for operating the first and second switch means, the low and high counts establishing the starts of the first and second time periods, respectively, the timing signal establishing the end of the second time period, and means responsive to the timing signal generating means for determining the count in the counting means upon the occurrence of the timing signal, the count being representative of the input signal.

OBJECTS, FEATURES, AND ADVANTAGES OF THE INVENTION

It is therefore the object of the present invention to solve the problem of stability in integrating analog-to-digital converters having a bipolar input. It is a feature of the present invention to solve this problem by using the exact same circuits and circuit elements for charging and discharging the integrating capacitor so that offset errors are automatically compensated for. It is another feature of the present invention to utilize the same constant current source to charge and discharge a capacitor to provide stability in an integrating analog-to-digital converter. It is still another feature of the present invention to position a capacitor between a source of supply potential and a constant current source and to switch the inputs of the capacitor during alternate cycles of operation.

The principal advantage of these features is an integrating analog-to-digital converter which accepts a bipolar input and provides for auto-zeroing of offset errors. Another advantage is that the resultant converter is low cost, low power, and has high accuracy. Another advantage is that the circuit is readily integratable on a single LSI chip. Another advantage is that the offset, speed, and gain of the comparator utilized in the circuit have no effect on the operation of the circuit. Another advantage is that there is no need to initialize the charge storing means since whatever initial charge may exist is automatically taken into consideration by the circuit.

Still other objects, features, and attendant advantages of the present invention will become apparent to those skilled in the art from a reading of the following detailed description of the preferred embodiment constructed in accordance therewith, taken in conjunction with the accompanying drawings wherein like numerals designate like parts in the several figures and wherein:

DESCRIPTION OF THE PREFERRED EMBODIMENT

Figure 1:
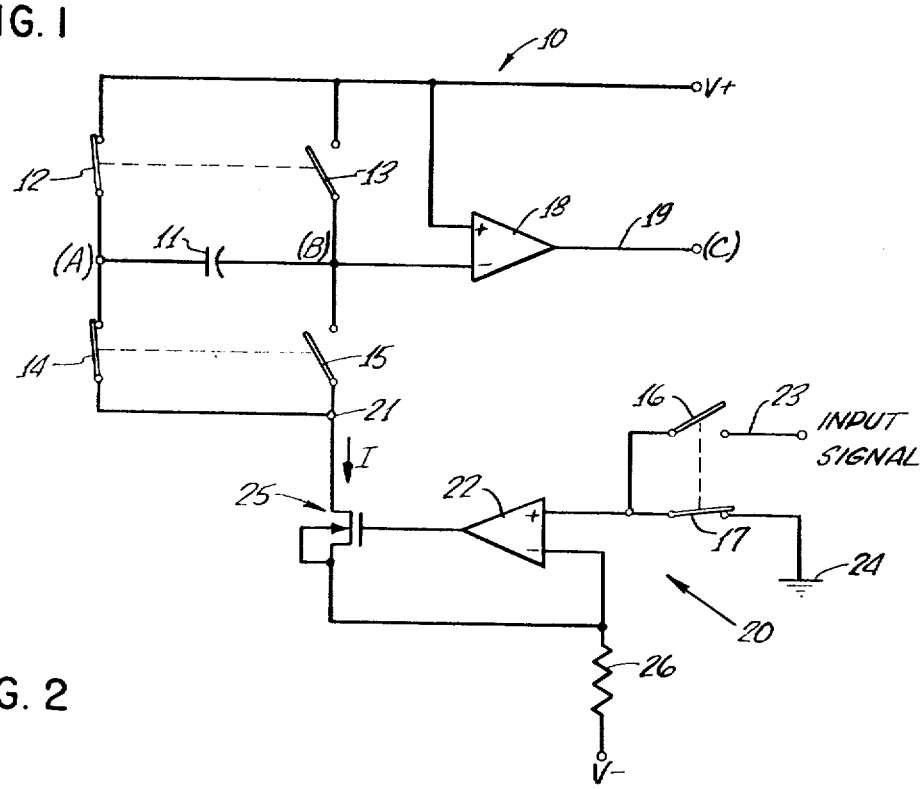
FIG. 1 is a schematic circuit diagram of a portion of an integrating analog-to-digital converter constructed in accordance with the teachings of the present invention.
Figure 4:
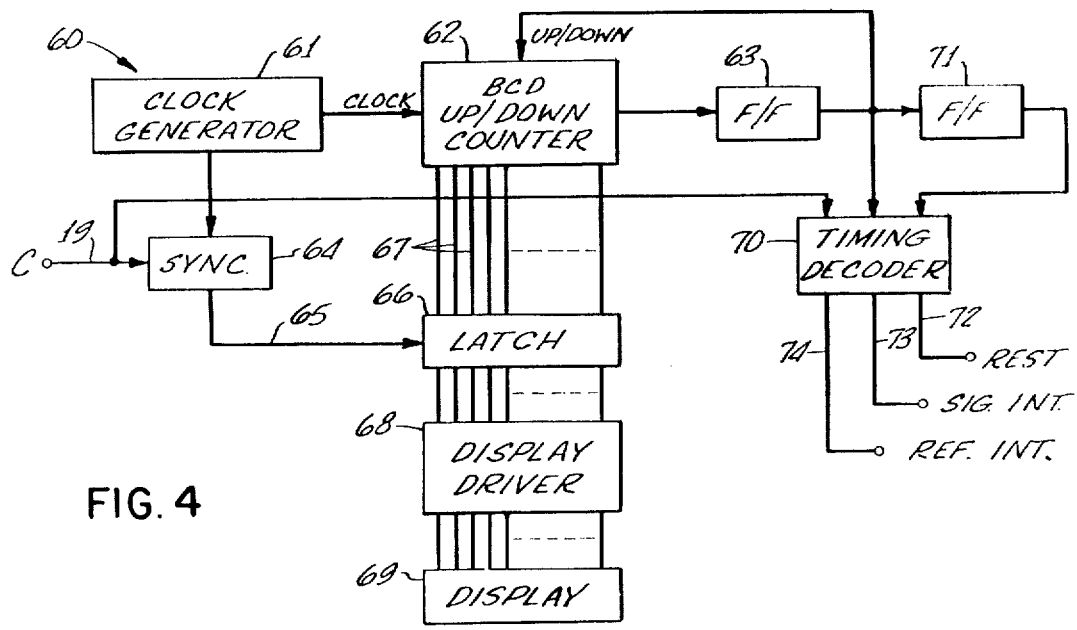
FIG. 4 is a block diagram of the digital timing and output circuitry of the present converter.

Referring now to the drawings and, more particularly, to FIG. 1 thereof, there is shown a simplified diagram of a portion of an integrating analog-to-digital converter, generally designated 10, constructed in accordance with the teachings of the present invention. The digital timing and output circuitry, generally designated 60, of converter 10 is shown in FIG. 4. Converter 10 uses a single capacitor 11 as the energy storing means, capacitor 11 being connectable by a plurality of switches 12-15 between a source of supply potential V+ and a constant current source 20. While switches 12-15 are shown as mechanical switches for ease of explanation, it will be obvious to those skilled in the art that transistor switches will, in practice, by used.

One side of capacitor 11 is connected via switch 12 to V+ and the other side thereof is connected via switch 13 to V+, switches 12 and 13 being interconnected for simultaneous operation. The one side of capacitor 11 is connected via switch 14 to a junction 21 at the output of current source 20 whereas the other side of capacitor 11 is connected via switch 15 to junction 21, switches 14 and 15 being interconnected for simultaneous operation. Circuit 10 also includes an amplifier 18 having an inverting input connected to the junction between switches 13 and 15 and capacitor 11 and a non-inverting input connected to V+. The output of amplifier 18 on line 19 produces a timing signal, to be described more fully hereinafter.

Constant current source 20 includes an operational amplifier 22 having a non-inverting input connected to first ends of first and second parallel switches 16 and 17 which are operatively interconnected for simultaneous operation. Switch 16 is capable of connecting the unknown input signal on line 23 to operational amplifier 22 whereas switch 17 connects the input of operational amplifier 22 to a point of common potential 24, shown as ground, for the bipolar input on line 23. The output of amplifier 22 is connected to the gate input of an NMOS transistor amplifier 25, the drain of which is connected to junction 21 and the source of which is connected to the inverting input of operational amplifier 22. The inverting input of operational amplifier 22 is also connected via a resistor 26 to a source of reference potential V−.

Figure 2:
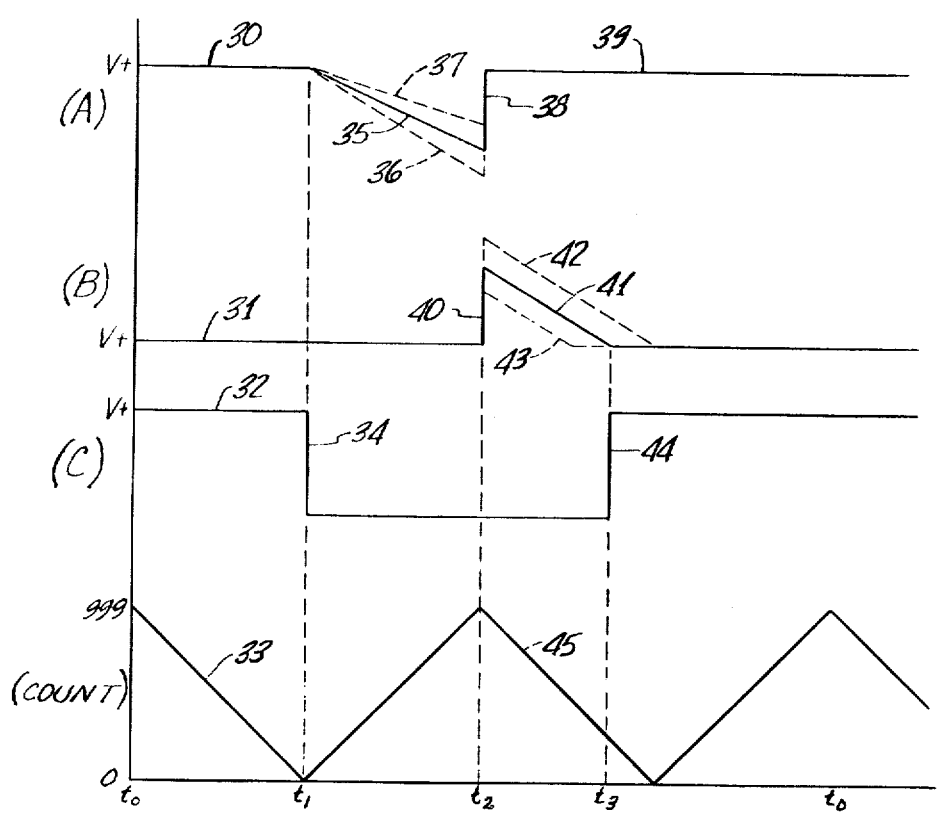
FIGS. 2 and 3 are each a series of waveforms useful in explaining the operation of the circuit of FIG. 1.
Figure 3:
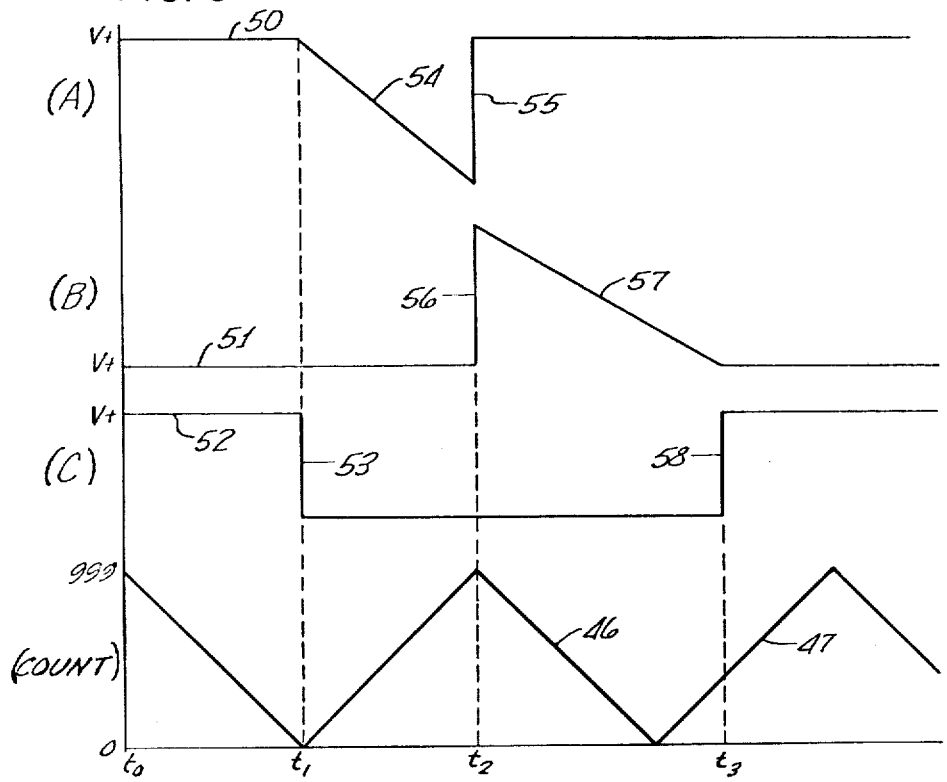

The operation of the circuitry of FIG. 1 will be described with reference to the waveforms of FIGS. 2 and 3 which depict the operation thereof for negative input signals and positive input signals, respectively. In FIGS. 2 and 3, there is shown the waveform at the junction between switches 12 and 14 and capacitor 11, designated A, the waveform at the junction between switches 13 and 15 and capacitor 11, designated B, the waveform on line 19 at the output of amplifier 18, designated C, and the output of a counting means 62, shown in FIG. 4 and to be described more fully hereinafter. For present purposes, suffice it to say that counter 62 continuously and alternately generates an up count and a down count between predetermined low and high counts, here 0 and 999.

At a time $t_0$, marking the start of a complete conversion cycle, counter 62 has just reached the count 999, switches 12 and 14 are closed, switches 13 and 15 are open, switch 16 is open and switch 17 is closed, all as shown. With the switches in this position, point A is connected directly to V+, as shown at 30, and point B is negative with respect to V+ by an amount equal to the input offset of amplifier 18. For simplicity in explaining the operation of circuit 10, it will be assumed that amplifier 18 has a small negative offset so that point B is near but slightly less than V+, as shown at 31. This assumption does not affect the operation of circuit 10. The output of operational amplifier 18 is also at V+, as shown at 32. These conditions are characterized as the start of the rest period of circuit 10.

During the rest period, starting at $t_0$, counter 62 counts down from 999 towards 0, as shown at 33. Also during this time, the current I flowing through constant current source 20 is drawn directly from V+ and there is no charging or discharging of capacitor 11.

When counter 62 reaches a predetermined low count, here a 0 count, at a time $t_1$, marking the start of the unknown signal integrate period of circuit 10, digital timing circuitry 60 reverses the positions of switches 12, 13, 16, and 17, switches 14 and 15 remaining in the positions shown in FIG. 1. This being the case, the current I now becomes a function of the unknown input signal on line 23. Since point B is not connected to V+, the output of amplifier 18 goes low, as shown at 34. Capacitor 11 is now connected between constant current source 20 and V+ via switches 13 and 14. While there is no instantaneous change in the voltage across capacitor 11, the charge thereacross now begins to change due to the current flow. Because the current supplied to capacitor 11 comes from a high impedance source (constant current generator 20), the voltage at point A ramps linearly in a negative direction, as shown at 35. The charging rate will be a function of and directly proportional to the input signal on line 23. If the input signal were zero, the voltage across capacitor 11 would ramp along dotted curve 36. However, since, in this case, the input signal is presumed to be negative with respect to the common potential, the charging current is reduced and the voltage ramps linearly at a slower rate. If the input signal were even more negative, the voltage at point A would ramp at an even slower rate, as shown by dotted curve 37.

In any event, the modification of the charge on capacitor 11 continues from an initial charge, here zero, and in a first direction at a rate determined by the input signal on line 23 for a first fixed time period determined by the previously referred to free running counter 62. That is, the unknown signal integrate period was initiated when counter 62 reached its predetermined low count, a count of 0, at time $t_1$, and continues until counter 62 reaches its predetermined high count, here a count of 999, at a time $t_2$.

At time $t_2$, marking the end of the fixed time unknown signal integrate period and the beginning of the variable time reference signal integrate period, digital timing circuit 60 causes all switches to reverse positions. That is, switches 12, 15, and 17 close and switches 13, 14, and 16 open. It should again be remembered that at the end of this time period, at $t_2$, the charge on capacitor 11 will be a function of the charging current and this is a function of the amplitude of the unknown input signal on line 23.

In any event, the reversal of switches 12–15 effectively reverses capacitor 11 between V+ and junction 21 so that modification of the charge thereon now proceeds in an opposite direction. That is, point A is immediately connected to V+ so that there is a jump in the voltage at point A, as shown at 38. Point A now stays at V+, as shown at 39. Since the voltage across a capacitor cannot change instantaneously, there is a corresponding change in the voltage at point B, as shown at 40. Thus, point B will jump in voltage above V+ by an amount equal to the existing charge on capacitor 11.

At this time, the voltage at point B will begin to ramp in a negative direction, as shown at 41. Since switch 16 is now open and switch 17 is now closed, the charging current will be fixed and capacitor 11 has its charge modified at a constant rate. On the other hand, the starting point will depend upon the charge previously accumulated across capacitor 11. Therefore, had the charge previously proceeded along curves 36 or 37, charging would now proceed along curves 42 or 43, respectively.

Amplifier 18 is operative to sense the voltage difference between point B and V+. Thus, when the charge on capacitor 11 returns to the initial charge, at a time $t_3$, point B is also returned to the offset voltage of amplifier 18, here near zero. As a result, the output of amplifier 18 goes high, as shown at 44. This terminates the reference signal integrate period. That is, digital timing circuitry 60 senses the change in the output of amplifier 18 and opens switch 15 and closes switch 14. It should be noted that switches 12–17 are now back in the positions which existed at time $t_0$.

It should be apparent to those skilled in the art that the offset of amplifier 18 and the initial charge on capacitor 11 do not affect the operation of circuit 10. Since the end of the reference signal integrate period is determined by the time when amplifier 18 goes low and this occurs when point B returns to the value it had at $t_1$, whatever offset or charge that existed at $t_1$ and was added during the period from $t_1$ to $t_2$ will be subtracted during the period from $t_2$ to $t_3$. Thus, circuit 10 automatically compensates for the offset of amplifier 18 and the initial charge on capacitor 11 and there is no necessity to initialize capacitor 11.

Considering further the circuitry in FIG. 1 below junction 21, during the fixed time unknown signal integrate period, from $t_1$ to $t_2$, switch 16 is closed and switch 17 is open. At $t_2$, switch 16 opens and switch 17 closes. Switch 17 connects the non-inverting input of operational amplifier 22 to common potential point 24. The current flow during the reference period is simply a function of the voltage V−, resistor 26, and the offset voltage of operational amplifier 22. Thus, the current from $t_2$ to $t_3$ is a fixed reference current. While the offset of amplifier 22 does not affect the auto-zeroing characteristic of circuit 10, it should be considered in selecting V−, the absolute magnitude of which determines the full scale calibration.

During the time from $t_1$ to $t_2$, when switch 17 is open and switch 16 is closed, the current is determined by the reference voltage source V− and also whatever voltage is applied to the non-inverting input of amplifier 22. In either event, the circuitry below junction 21 operates as a constant current source, in one case the current I being variable and the other case the current I being fixed.

If the input voltage is zero, the reference current and the variable current will be equal. Therefore, it will take the same amount of time to modify the charge on capacitor 11 during the unknown signal integrate period and the reference signal integrate period and time $t_3$ will correspond to a zero count of counter 62. This corresponds to curves 36 and 42 in FIG. 2 and it will be seen that the voltage at point B returns to V+ at a count of 0. As the input voltage on line 23 increases in magnitude of a negative polarity, the charging current during the unknown signal integrate period decreases so that during the subsequent reference signal integrate period, from $t_2$ to $t_3$, it takes less time for the charge on capacitor 11 to return to the initial charge. During the initial portion of the reference signal integrate period, counter 62 is counting backwards, as shown at 45, so that $t_3$ occurs before it reaches a 0 count. It can be seen that the greater the magnitude of input voltage, with a negative polarity, the less change will occur in the charge on capacitor 11 during the unknown signal integrate period and the less time it will take to return to the initial charge. The extreme condition will be met when the charging current during the unknown signal integrate period is zero so that the output count at $t_3$ is −999. In any event, for negative input signals, the output of counter 62 will have a negative value that will be directly proportional to the magnitude of the input signal.

On the other hand, as the input voltage increases in magnitude of a positive polarity, the current I during the unknown signal integrate period, from $t_1$ to $t_2$, will be increased rather than decreased. This condition is shown in FIG. 3 where the initial voltages at points A, B, and C, shown at 50, 51, and 52, respectively, are the same as described previously with regard to FIG. 2. At $t_1$, the output of amplifier 18 reverses, as shown at 53, and the voltage at point A begins to ramp linearly, as shown at 54. At $t_2$, as determined by the count in counter 62, when switches 12–17 reverse, point A is immediately connected to V+ so that there is a jump in the voltage at point A, as shown at 55. There is a corresponding jump in voltage at point B, as shown at 56. The voltage at point B will now ramp in a negative direction, as shown at 57, until amplifier 18 senses that the charge on capacitor 11 has returned to the initial charge, causing the output thereof to change state, as shown at 58.

During this time, from $t_2$ to $t_3$, counter 62 will count down to 0, as shown at 46, and then start counting up towards 999, as shown at 47. The larger the input voltage on line 23, the greater the time interval between $t_2$ and $t_3$ so that the count will increase with increasing magnitude signals. Accordingly for positive input signals, the output of counter 62 will have a positive value that will be directly proportional to the magnitude of the input signal.

The net effect is that there is no longer a requirement that the input voltage have an opposite polarity from the reference voltage or a fixed polarity as is the case in most prior art systems. The present circuit converts the input voltage to a charge modifying current and a single circuit produces both positive and negative output counts.

Referring now to FIG. 4, there is shown circuitry 60 for operating switches 12-17 and for providing a digital output representing the amplitude of the analog input signal on line 23. More specifically, digital timing and output circuitry 60 includes a clock oscillator 61 for generating regularly recurring timing pulses and a binary-coded-decimal up/down counter 62 responsive to the clock pulses from oscillator 61 for continuously counting same. Counter 62 counts between predetermined low and high counts, here 0 and 999. A signal indicating that the low or high count has been reached is applied by counter 62 to a flip-flop 63, the output of which is connected back to the reversing input of counter 62. Therefore, each time counter 62 reaches either its low or high count, the output of flip-flop 63 changes state to signal counter 62 to now begin counting in the opposite direction.

The output of oscillator 61 is also connected to a synchronizing circuit 64 which receives the output from operational amplifier 18 on line 19, heretofore designated point C. Circuit 64 synchronizes the change in state of the output of operational amplifier 18 with the timing pulses of clock oscillator 61 and produces a synchronized output on a line 65 whenever the output of operational amplifier 18 goes high. Recalling that this occurs at time $t_3$ and, in fact, defines time $t_3$, the output of sync circuit 64 on line 65 is applied to a latch circuit 66 which receives the count output of counter 62 on lines 67. The output of latch circuit 66 is applied to a display driver 68, the output of which is connected to a display 69. Thus, when the signal on line 65 causes latch 66 to read-out the count in counter 62, this count is applied via driver 68 to display 69 to display such count.

Digital timing and output circuitry 60 also includes a timing decoder circuit 70 which receives the output of operational amplifier on line 19, the output of flip-flop 63, and the output of a flip-flop 71, the input of which is connected to the output of flip-flop 63. Timing decoder 70 is a conventional digital logic circuit for producing three timing pulses on lines 72, 73, and 74 defining the rest period of circuit 10, the unknown signal integrate period of circuit 10, and the reference signal integrate period of circuit 10, respectively.

The operation of circuitry 60 of FIG. 4 will be described with reference to the waveforms of FIG. 5 which shows the outputs of flip-flops 63 and 71, the three outputs of timing decoder 70, and the output of counter 62. As indicated previously, a function of digital timing and output circuitry 60 is to provide sequential timing commands for the opening and closing of switches 12-17. This is accomplished by dividing the clock pulse output of oscillator 61 with up/down counter 62 so as to establish a fixed counting period. In other words, it will take counter 62 a given fixed time to count either from 0 to 999 or from 999 to 0. Flip-flops 63 and 71 and timing decoder 70 generate the remaining timing commands for the measurement cycle. Termination of the reference signal integrate period, at $t_3$, is the only timing command not directly initiated by the output of flip-flop 63. In addition to establishing switch actuation sequences, digital timing and output circuitry 60 also converts the data from circuit 10 into display information proportional to the absolute value and polarity of the input signal.

Figure 5:
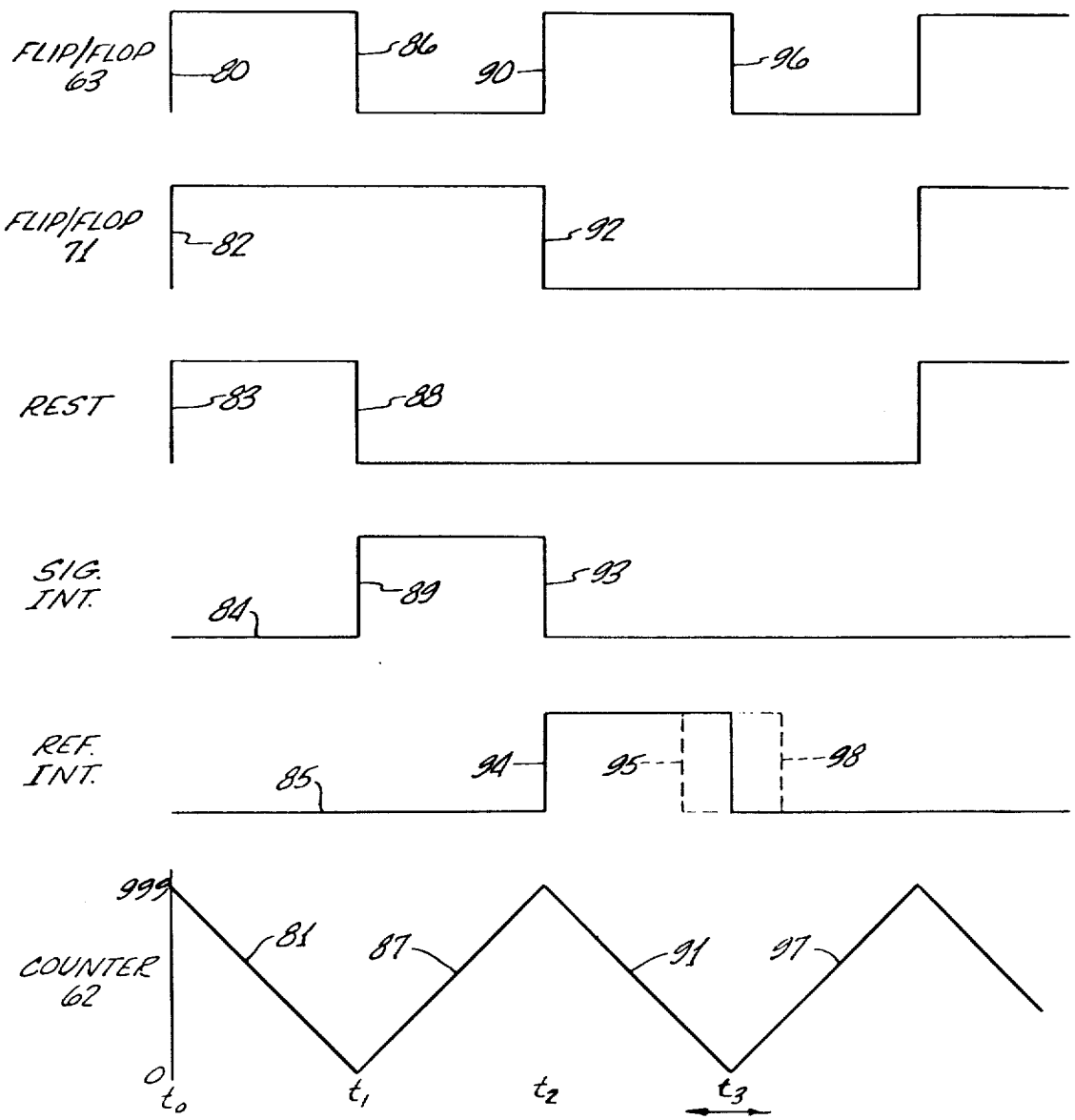
FIG. 5 is a series of waveforms useful in explaining the operation of FIG. 4.

With reference to FIGS. 4 and 5, assume that at to counter 62 has just completed counting clock pulses from oscillator 61 in an up count direction and reached count 999. This count causes flip-flop 63 to go high, as shown at 80, thereby signalling counter 62 to reverse its counting direction, as shown at 81. The output of flip-flop 63 is also applied to timing decoder 70 and to flip-flop 71 which also goes high, as shown at 82. This output of flip-flop 71 is also applied to timing decoder 70 which interprets the two high inputs as indicating the start of the rest period. Accordingly, the output of timing decoder 70 on line 72 goes high, as shown at 83. At this time, there are no changes in the signals on output lines 73 and 74, as shown at 84 and 85.

When counter 62 reaches a 0 count, marking the start of the unknown signal integrate period, the output of flip-flop 63 goes low, as shown at 86, which signals counter 62 to reverse its counting direction, counter 62 now starting to count up, as shown at 87. Flip-flop 71 does not change state at this time, responding only to positive-going transitions at its input. Timing decoder 70 interprets the low output from flip-flop 63 and the high output from flip-flop 71 as the end of the rest period and the start of the unknown signal integrate period causing its output on line 72 to go low, as shown at 88, and its output on line 73 to go high, as shown at 89. The signal on line 73 is applied to switches 12, 13, 16 and 17 to cause them to reverse positions, as described previously.

When counter 62 again reaches a count of 999, the output of flip-flop 63 again goes high, as shown at 90, which signals counter 62 to reverse its counting direction, whereupon counter 62 begins counting down, as shown at 91. The positive-going transition at the output of flip-flop 63 causes flip-flop 71 to change state, the output of which goes low, as shown at 92. Timing decoder 70 interprets the high output from flip-flop 63 and the low output from flip-flop 71 as signalling the end of the unknown signal integrate period and the start of the reference signal integrate period. Thus, the unknown signal integrate output on line 73 goes low, as shown at 93, and the reference signal integrate output on line 74 goes high, as shown at 94. The unknown signal integrate signal on line 73 is used to reverse switches 12, 13, 16 and 17, while the reference integrate signal is used to reverse switches 14 and 15.

At this time, the low output of flip-flop 71 indicates to timing decoder 70 that the reference signal integrate period is proceeding. One of two events will occur next. Either the output of operational amplifier 18 will go high, in the event of a negative polarity input signal, or counter 62 will reach a 0 count, in the event of a positive polarity input signal. If the former situation occurs first, timing decoder 70, in response to the positive-going timing signal on line 19, signals the end of the reference signal integrate period by going low, as shown at 95, and this signal is used to reverse the positions of switches 14 and 15. The same signal on line 19 causes latch 66 to read out the output of counter 62 for display by display 69.

If, instead, counter 62 first reaches a count of 0, the output of flip-flop 63 goes low, as shown at 96, which signals counter 62 to reverse its counting direction, counter 62 commencing counting up, as shown at 97. Since the output of flip-flop 71 remains low and no signal is received from amplifier 18, timing decoder 70 makes no change in any of its output signals. Rather, decoder 70 waits until the signal on line 19 from amplifier 18 goes high before it terminates the reference signal integrate period, which would now occur as shown at 98. At this time, the output count of counter 62 would be applied by latch 66 to display 69 which would display a positive count.

It can therefore be seen that according to the present invention, the problems encountered heretofore in bipolar integrating analog-to-digital converters are solved in a manner which results in auto-zeroing of offset errors. This is achieved by using the exact same circuits and circuit elements in both the charging and discharging cycles of capacitor 11. In this manner, whatever offsets or drifts which occur and which affect one cycle, affect the other in an equal and opposite manner. The result is that these offsets and drifts are automatically compensated for, the only requirement being that the circuit elements be stable during a complete cycle of operation.

The present system has no components which affect the location of the zero point and no additional compensation circuitry is required. This also permits the use of an amplifier 18 in which it can be shown that the offset, speed of operation, and gain have no effect on the operation of circuitry 10 and ar of no operational concern.

There is also no necessity for initializing the charge on capacitor 11. If the charge on capacitor 11 at the start of the unknown signal integrate period is other than a non-zero value, this will be automatically accounted for when the capacitor is reversed in the circuit and begins charging in an opposite direction.

While the invention has been described with respect to the preferred physical embodiment constructed in accordance therewith, it will be apparent to those skilled in the art that various modifications and improvements may be made without departing from the scope and spirit of the invention. For example, the inputs of amplifier 18 may be connected directly across capacitor 11 without affecting the operation of circuit 10. Furthermore, other implementations of constant current source 20 will be apparent to those skilled in the art. Accordingly, it is to be understood that the invention is not to be limited by the specific illustrative embodiment, but only by the scope of the appended claims.

I claim:

1. In an integrating analog-to-digital converter circuit for producing a digital output signal representing the value of an analog input voltage, the converter including a voltage-controlled current source for supplying to an integrator capacitor a capacitor current which alternately equals a fixed value and a value dependent on the analog input voltage, an improvement wherein the voltage-controlled current source comprises:

a current node through which flows the capacitor current;

first and second input terminals adapted for receipt of the analog input voltage thereacross;

an amplifier having first and second inputs and an output, one of the two inputs being inverting and the other input being non-inverting;

an input switching circuit for connecting the first amplifier input to the first input terminal when the capacitor current depends on the analog input voltage and to the second input terminal when the capacitor current equals the fixed current value;

a resistor having first and second terminals, the first resistor terminal being connected to the second amplifier input;

means for applying a fixed voltage between the second resistor terminal and the second input terminal; and a transistor comprising a first transistor terminal, a second transistor terminal and a control terminal such that a voltage between the control terminal and the second transistor terminal affects the amount of a current flowing through the first transistor terminal, wherein one of the first and second transistor terminals connects to the current node, the other one of the two transistor terminals connects to the second amplifier input, and the control terminal connects to the amplifier output;

whereby the fixed value of the capacitor current equals the input-dependent value thereof when the analog input voltage equals zero.

2. A converter circuit according to claim 1, wherein the first transistor terminal, the second transistor terminal and the control terminal are the collector, the emitter and the base of the transistor, respectively.

3. A converter circuit according to claim 2, wherein the first transistor terminal, the second transistor terminal and the control terminal are the drain, the source, and the gate of the transistor, respectively.

* * * * *